United States Patent
Lorusso et al.

(10) Patent No.: US 6,784,425 B1
(45) Date of Patent: Aug. 31, 2004

(54) ENERGY FILTER MULTIPLEXING

(75) Inventors: Gian Francesco Lorusso, Union City, CA (US); Laurence Stuart Hordon, Santa Clara, CA (US); Sander Josef Gubbens, San Carlos, CA (US); Douglas Keith Masnaghetti, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 188 days.

(21) Appl. No.: 10/008,253

(22) Filed: Nov. 9, 2001

Related U.S. Application Data

(60) Provisional application No. 60/302,141, filed on Jun. 29, 2001.

(51) Int. Cl.[7] .............................................. H01J 47/00
(52) U.S. Cl. ....................... 250/305; 250/306; 250/309; 250/310
(58) Field of Search ................................ 250/305–306, 250/309, 310

(56) References Cited

U.S. PATENT DOCUMENTS

| | | | |
|---|---|---|---|
| 4,983,830 A | * | 1/1991 | Iwasaki ...................... 250/309 |
| 5,321,262 A | | 6/1994 | Turner |
| 5,877,498 A | | 3/1999 | Sugimoto et al. |
| 6,344,750 B1 | * | 2/2002 | Lo et al. ..................... 324/751 |

* cited by examiner

Primary Examiner—John R. Lee
Assistant Examiner—Paul M. Gurzo
(74) Attorney, Agent, or Firm—Beyer Weaver & Thomas, LLP

(57) ABSTRACT

The present invention pertains to a technique of electron spectroscopic imaging that is easy to perform and cost effective. This technique allows for spatial resolution enhancement of electron beam semiconductor inspection systems (for example a critical dimension scanning electron microscope CD-SEM) as well as to obtain useful physical or chemical information on the investigated specimen. The technique involves a high pass energy filter that is alternately set, or multiplexed, at two energies. For an inspected area on a specimen, the detected intensity level at the higher energy setting is subtracted from the intensity level at the lower energy setting. The obtained differential value corresponds to electrons having energy within the range of the first and second filter settings. This obtained differential value is used to generate an image of the specimen for inspection purposes.

21 Claims, 6 Drawing Sheets

ENERGY FILTER MULTIPLEXING

This application claims the benefit of provisional application 60/302,141 filed on Jun. 29, 2001.

FIELD OF THE INVENTION

The present invention relates generally to semiconductor wafer inspection, and more specifically to electron spectroscopic imaging techniques.

BACKGROUND OF THE INVENTION

Semiconductor fabrication technology produces devices that have circuit structures with extremely small critical dimensions. Semiconductor wafer inspection systems require a high level of resolution in order to determine the integrity of these extremely small structures. One common inspection technique involves the use of an electron beam, for example, within a scanning electron microscope. However, the capabilities of these techniques are reaching the limit of their usefulness when considering the continually shrinking size of integrated circuit critical dimensions. As a result, the resolution of these techniques may not be high enough to provide useful inspection data.

Enhancement of spatial resolution, as well as useful physical or chemical information, can be achieved through electron energy discrimination, i.e. electron spectroscopic imaging (L. Reimer "Image Formation in Low-Voltage Scanning Electron Microscopy", Ed. SPIE Optical Engineering Press, 1993, p. 2). In fact, electrons with different energy are representative of different interaction volumes within the sample. By selecting the proper energy range, it is then possible to minimize the beam-sample interaction volume, thus improving the spatial resolution of an electron microscope.

Generally, an inspecting electron beam that is directed at a spot on a semiconductor wafer causes electrons to scatter from the spot. FIG. 1 illustrates a generic electron energy spectrum 100 for electrons that are caused to scatter from a semiconductor wafer due to an electron beam. As it is commonly known, both secondary electrons 102 and backscattered electrons 104 can be useful for specific inspection techniques. Energy level 106 represents the maximum energy level detected by the inspection machine, which is equivalent to the energy level of the electron beam.

Various spectroscopy techniques are known for selecting a certain region in the energy spectrum during inspection processes. One known technique utilizes a dispersive element, for example, a magnetic field. A dispersive element separates an electron beam into a spectrum of its various component energy levels. This is analogous to a prism that separates white light into a spectrum of primary colors. Detectors can then be used to detect the electron intensity levels at desired ranges of energy. Unfortunately, these techniques are generally difficult and expensive to built.

In view of the foregoing, a spectroscopic technique that is easy to implement, cost effective, and that provides a high spectral resolution would be desirable.

BRIEF SUMMARY OF THE INVENTION

The present invention pertains to a simple and cost effective technique for obtaining spectral information in an electron microscope. Some applications of this technique are high-resolution imaging and elemental mapping. The technique involves a high pass energy filter that is alternately set, or multiplexed, at two energy levels. For an inspected area on a wafer, the detected intensity level at the higher energy setting is subtracted from the intensity level at the lower energy setting. The resulting intensity level (the differential value) corresponds to the detected electron energy within the energy range of the first and second filter settings. Accordingly, images of the wafer for specific energy ranges may then be obtained One aspect of the present invention pertains to a high spatial resolution method for inspecting a specimen by detecting electrons that scatter from the specimen. This method includes scanning and directing an electron beam to irradiate a spot on the specimen, the electron beam causing the electrons to scatter from the irradiated spot on the specimen. A high pass filter is then set at a first voltage level. Then the scattered electrons are detected with the high pass filter to measure a first electron intensity level. Then the high pass filter is set at a second voltage level. Then the scattered electrons are detected with the high pass filter to measure a second electron intensity level. A differential electron intensity level, which is the difference between the first electron intensity level and the second electron intensity level is then determined. The differential electron intensity level is the electron intensity level in an energy window between the first and second voltage level. By using this technique, the spatial resolution of the electron microscope can be enhanced by appropriately selecting the energy window of the detected electrons.

An alternative application of the method is used to identify an interface between two different materials on the specimen. Yet another alternative application of the method is used to perform spectroscopy on the specimen.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so as not to unnecessarily obscure the present invention.

The present invention pertains to a simple and cost effective technique for obtaining spectral information on semiconductor wafers that is easy to perform and cost effective. Specifically, the technique is utilized in combination with electron beam semiconductor inspection systems, for example a critical dimension scanning electron microscope (CD-SEM), to obtain high-resolution images. The technique involves an energy filter multiplexer that includes a filter that is alternately set, or multiplexed, at two energy levels.

As is commonly known, a high pass energy filter basically includes (in its simplest configuration) a grid that is negatively charged so that it deflects electrons. The grid voltage is set to a certain voltage setting so that only electrons with a sufficient amount of energy can pass through the grid and be detected by the detector on the other side of the grid. An energy filter provides a high level of spectral resolution since high pass filters can be easily designed to have a very clear cut off. Clear cut offs prevent electrons having energy levels below the setting of a filter from passing through the grid and allow electrons having energy levels above the setting of the filter to pass through the grid. The clear cut off of electrons detected by high pass filters allows inspection processes to utilize electrons only within a specific energy range.

Multiplexing of the high pass energy filter can be performed at a fast enough rate that it is possible to progressively show images as the electron beam scans over the semiconductor wafer. This is done by presenting the image relating to the differential intensity value, while the inspection system acquires the data required for the successive image. Multiplexing speeds can vary depending upon the scanning rate of a specific inspection system's electron beam.

Figure 1:
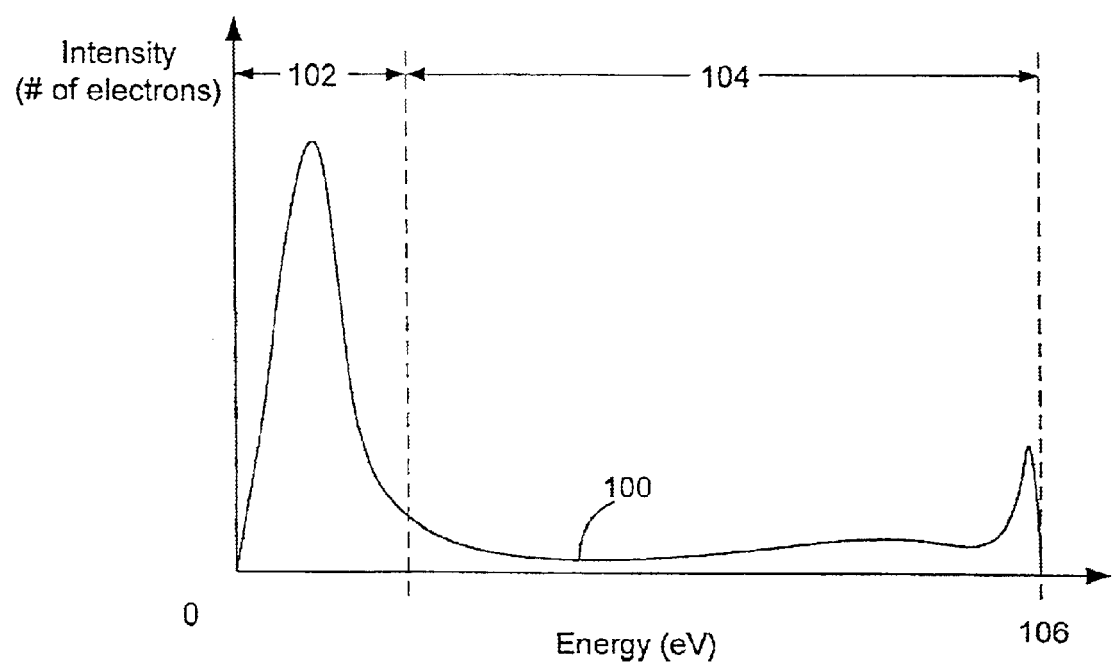
FIG. 1 illustrates a typical electron energy spectrum for electrons that are caused to scatter from a semiconductor wafer due to an electron beam.
Figure 2:
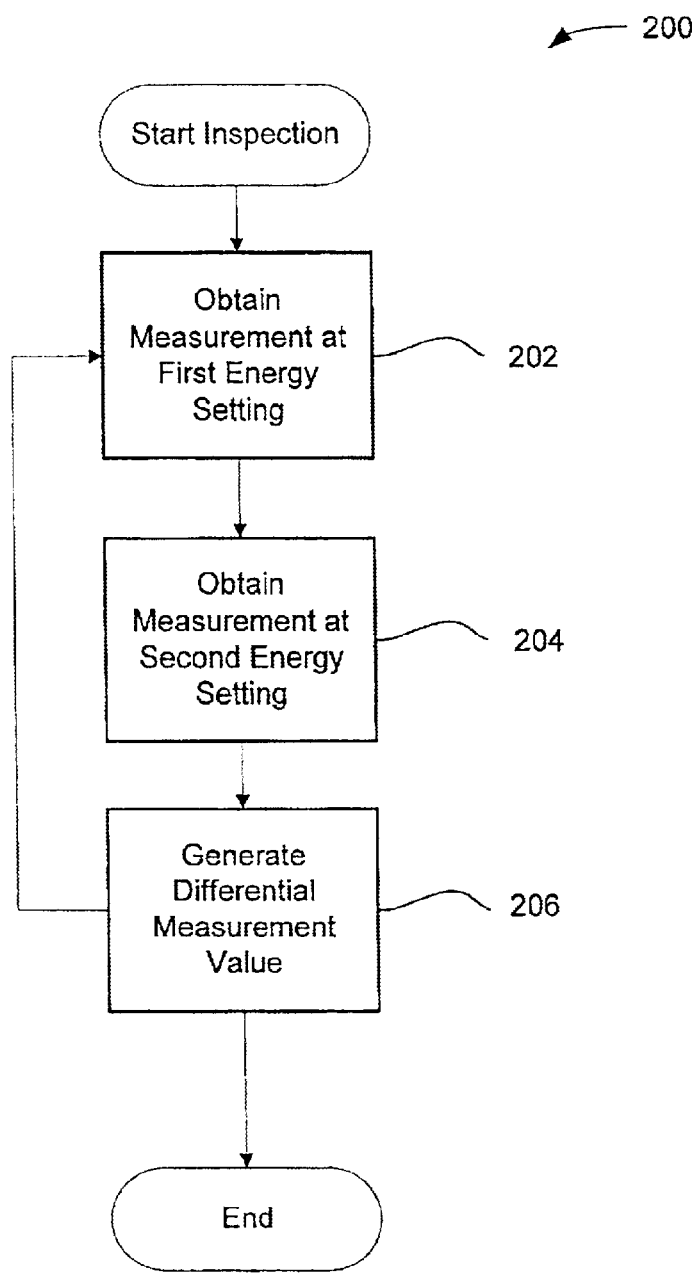
FIG. 2 illustrates a flow diagram representing the inspection process of multiplexing a high pass filter in order to obtain an image of a wafer according to one application of the inventive technique.
Figure 3A:
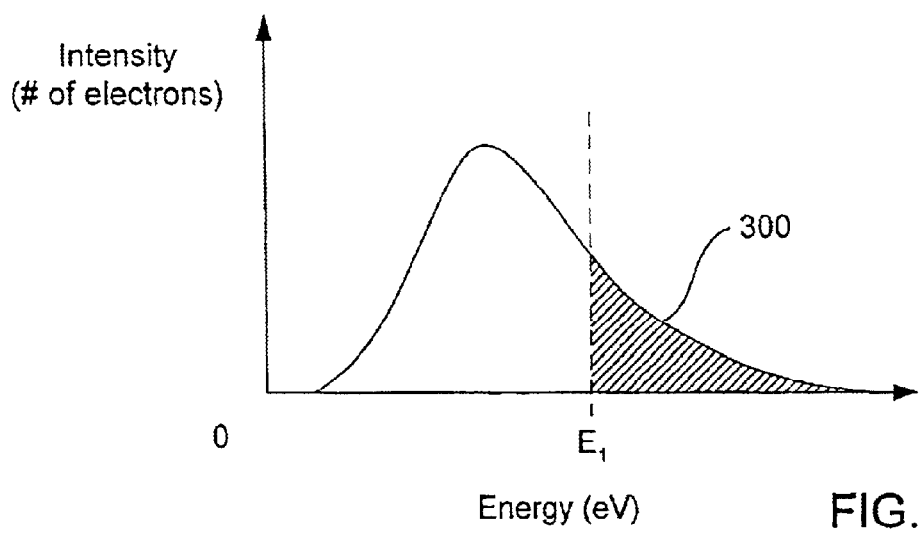
FIG. 3A represents the distribution of energy of the electrons that scatter from the wafer wherein the crosshatched area represents the electrons with energy from $E_1$ to the maximum allowed energy level.

FIG. 2 illustrates a flow diagram representing the inspection process 200 of multiplexing a high pass filter in order to obtain an image of a wafer according to one application of the inventive technique. The inspection process 200 starts at block 202 where a high pass filter is set at a first voltage setting, $E_1$. At this setting, electrons having energy levels of $E_1$ and greater will be detected by the inspection system and therefore provide an output electron intensity value, $I_1$. This is represented in FIG. 3A. FIG. 3A represents the distribution of energy of the electrons that scatter from the wafer wherein the cross-hatched area 300 represents the electrons with energy from $E_1$ to the maximum allowed energy level. The cross-hatched area represents the value of $I_1$. For calculation purposes, $I_1$ is basically the integral of the signal intensity value from the energy level of $E_1$ to the maximum electron energy level.

Figure 3B:
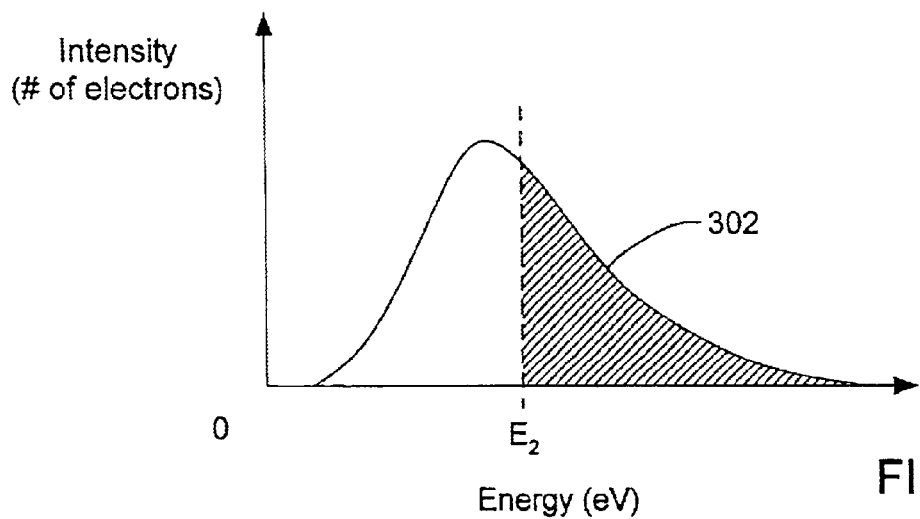
FIG. 3B represents the distribution of energy of the electrons that scatter from the wafer wherein the crosshatched area represents the electrons with energy from $E_2$ to the maximum allowed energy level.

In block 204, the high pass filter is set at a second energy level $E_2$, which happens to be a lower level than $E_1$. The lower level of $E_2$ allows more electrons to pass through the filter, therefore, the output intensity value, $I_2$ is larger than $I_1$. The cross-hatched area 302 in FIG. 3B represents the distribution of energy of the electrons that scatter from the wafer wherein the cross-hatched area represents the electrons with energy from $E_2$ to the maximum allowed energy level. The cross-hatched area 302 represents the value of $I_2$. Again the value of $I_2$ is the integral of the intensity from $E_2$ to the maximum electron energy level.

Figure 3C:
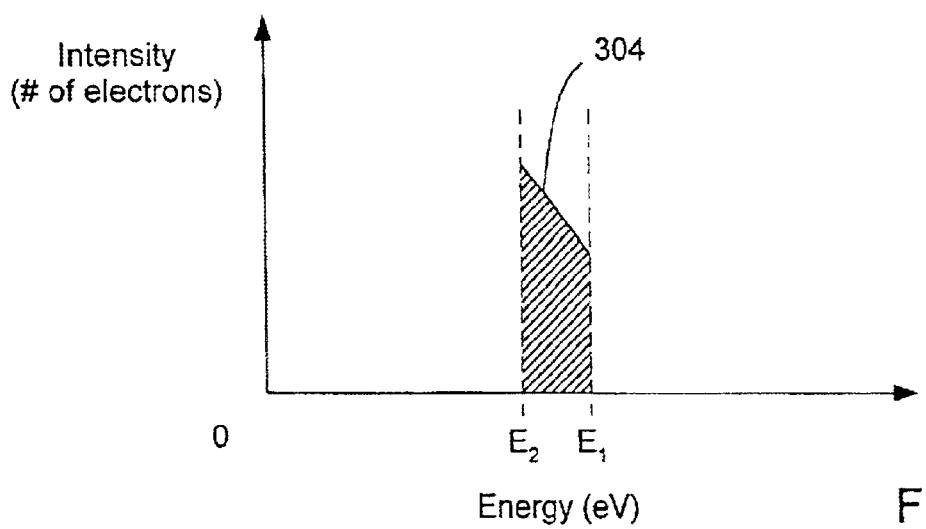
FIG. 3C represents the electrons in the energy range from $E_1$ to $E_2$.

In block 206, $I_1$ is subtracted from $I_2$ to result in a resultant value, $I_{Result}$. A graphical representation of $I_{Result}$ is illustrated by the cross-sectional area 304 in FIG. 3C. $I_{Result}$ forms just a single component of information needed to provide a complete set of data for inspection purposes.

Function blocks 202, 204 and 206 assume that the energy filter in second setting was set lower than the first. In the alternative case where the energy filter in the first setting is set lower than the energy of the second, then, subtract the second detected energy level from the first energy level.

The blocks 202, 204, and 206 are repeated for as many times as required to provide a complete set of data required for inspection purposes. For example, a set of $I_{result}$ values can be used to form an inspection image. The transition in energy setting from $E_1$ to $E_2$ in blocks 202 and 204 represents the multiplexing of the high pass energy filter. The energy levels of $E_1$ and $E_2$ are selected depending upon the desired energy range that is to be used for inspection of the semiconductor wafer.

In alternative embodiments, each value of $I_{result}$ is used to generate an image of the region on a specimen that is irradiated with a particle beam, such as an electron beam. In such cases, the subsequently acquired values of $I_{result}$ provide newer (or refreshed) images of the irradiated region on the specimen. By repeating blocks 202, 204 and 206, the inspection system can provide continuously refreshed images so that real-time images of the specimen can be shown. This is advantageous when the electron beam is scanned across the surface of the specimen because an inspection operator has the ability to view sections of the specimen while scanning the specimen.

The high pass filter multiplexing technique can be used in two different modes for generating images of a specimen such as a semiconductor wafer. These modes are a static mode in which a single image is generated and a real-time mode in which images are repeatedly generated so that real-time images of the specimen can be viewed.

In one embodiment of the invention, the static mode involves setting the high pass filter at a first voltage level and then detecting the electrons scattering from the specimen. The intensity level measured at the first voltage is used to form a first image of the inspected region of the specimen. Then the high pass filter is set at a second voltage level and the intensity level of electrons scattering from the specimen is measured again. The intensity level at the second voltage level is used to generate a second image of the inspected region. Then a resulting image is generated by taking the difference between each of the images generated at the first and second voltage levels. In essence, the static mode of using the high pass filter energy multiplexer is a technique of taking a single image of an inspected area on a specimen.

The real-time mode of the present invention involves repeatedly measuring a first and then a second electron intensity level to continuously generate refreshed resulting images of the inspected region. By generating the refreshed resulting image quickly, a monitor displaying the images of the specimen can substantially display images of the specimen in real-time. In some implementations of the present invention, the inspection system moves across the surface of the specimen in order to visually inspect various regions of the specimen. The real-time mode capability of continuously generating refreshed images allows an inspection operator to view the scanned surface of the specimen in real time while scanning. When the inspection system is scanned, the rate at which refreshed images are generated is sufficiently fast in comparison with the speed of scanning the inspection system to maintain the real-time image representation of the specimen.

In some implementations of the real-time mode, the voltage on the high pass filter is set back to the first voltage setting while the differential electron intensity value is being determined. In other words, the process of obtaining the next image starts before the first resulting image is even obtained.

Figure 4:
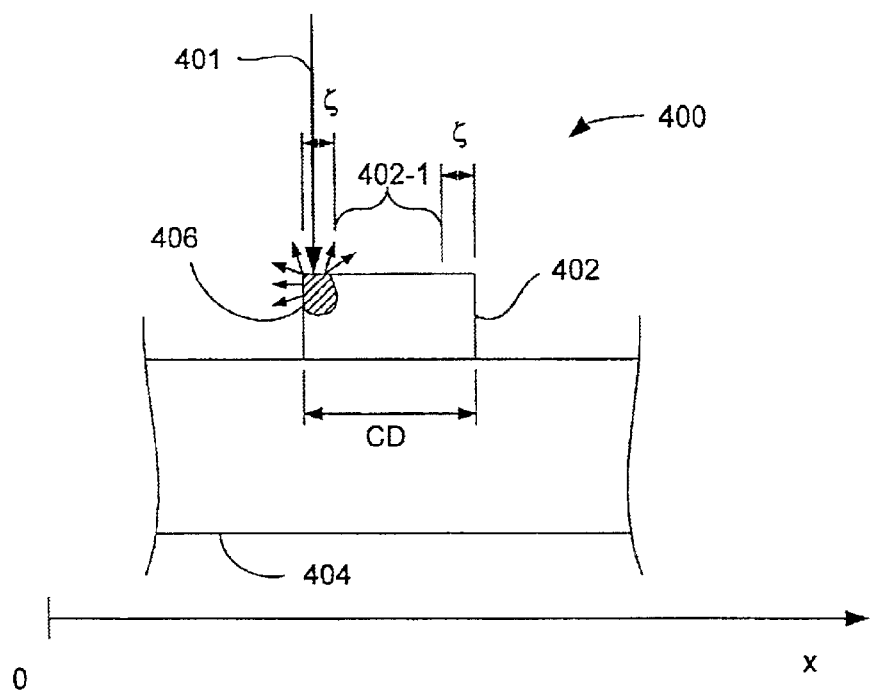
FIG. 4 illustrates a side plan view of an electron beam that is scanning across a portion of a semiconductor wafer, which has a line structure formed on a substrate.
Figure 5:
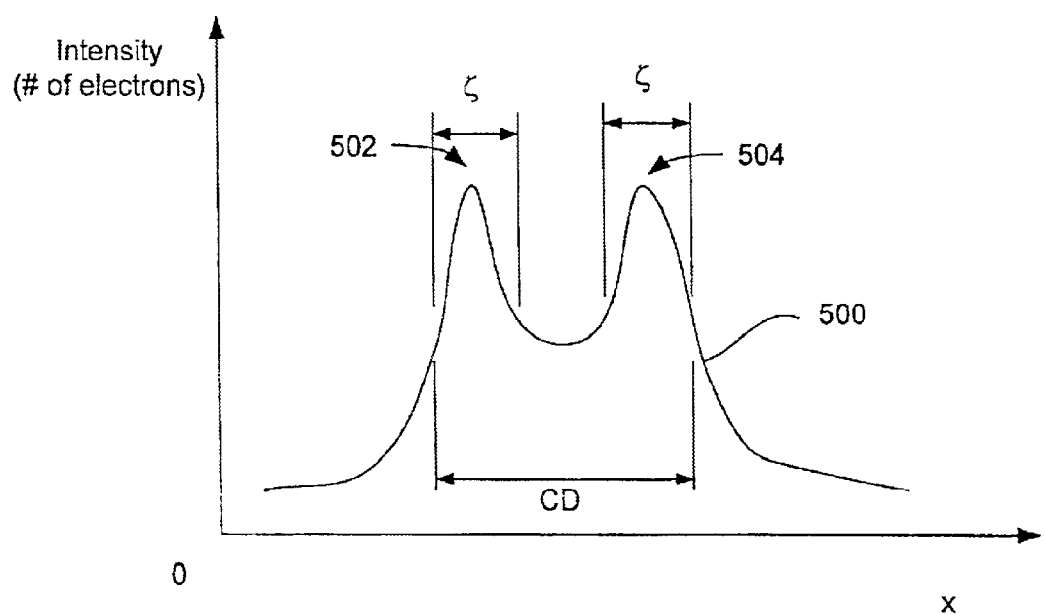
FIG. 5 illustrates a representative electron intensity level curve obtained by the high pass filter energy multiplexer as it is scanned across the semiconductor wafer of FIG. 4.
Figure 6:
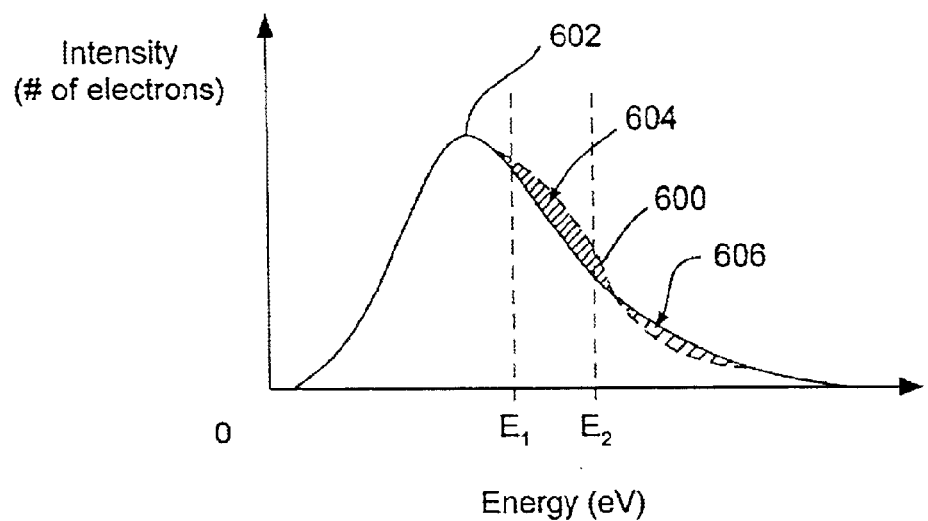
FIG. 6 illustrates a graph of two electron energy distribution curves, each representing two different materials for which their interface location is desired to be determined.
Figure 7:
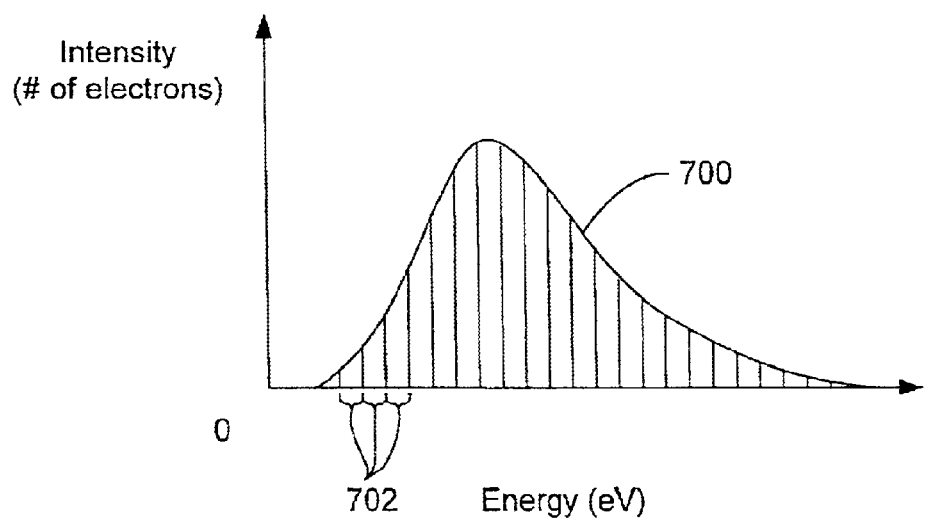
FIG. 7 is presented to illustrate a technique of using the high pass filter energy multiplexer to perform spectroscopy.

Now that the concept of energy filter multiplexing technique has been described, various applications will be described. FIG. 4 and FIG. 5 illustrate the use of the inventive technique to identify a line structure formed on a substrate. FIG. 6 illustrates the basic concept behind a material mapping technique using the present invention. And FIG. 7 illustrates an energy spectrum that can be obtained by using the present invention.

The first exemplary use of the energy filter multiplexing technique will now be described. FIG. 4 illustrates a side plan view of an electron beam 401 that is scanning across a portion of a semiconductor wafer 400, which has a line structure 402 formed on a substrate 404. Line structure 402 has a critical dimension (CD) that is the width of the line structure 402. $\zeta$ is referred to as the secondary electron mean free path (SE MFP) in the material. The cross-hatched area in line structure 402 is referred to as the interaction volume 406, within which electrons scatter and then possibly exit the line structure 402. For instance, the line structure may be a photo-resist line formed on a silicon substrate. An x-axis representing the distance across the semiconductor wafer portion 400 is shown beneath the wafer portion 400.

One goal of the inspection process is to determine the size of the line structure 402. As illustrated, when the electron beam is incident on the outer edge of the line structure 402, secondary electrons are caused to scatter back in the direction of the electron beam and laterally out of the side edges of the line structure 402. The excess of secondary electrons emitting from the sides of the line structure 402 cause the level of detected current intensity within the secondary electron energy spectrum to be higher at the edges than at the interior portion 402-1 of the line structure 402. As will be shown below, the size of $\zeta$ limits the image resolution capabilities for the line structure 402.

FIG. 5 illustrates a generic electron intensity level curve 500 obtained as the electron beam is scanned across the semiconductor wafer 400 of FIG. 4. The higher intensity level peaks 502 and 504 of the intensity level curve 500 represent the higher secondary electron emissions at the outer edges of the line structure 402. The obvious limit to the smallest measurable critical dimension (CD) of the line structure 402 is designated by width of the peaks 502 and 504. Since this width is proportional to the electron MFP in the material, the result is that the lower the MFP, the smaller is the measurable CD.

The SE image resolution can be increased by selecting an appropriate electron energy window with which to create an image. This is because the mean free path, $\zeta$, varies with the secondary electrons energy (David C. Joy "Ultralow-energy Imaging for Metrology" Proc. SPIE Vol. 3332, p.42–50). $\zeta$ typically is higher at the low and high ends of the electron energy spectrum, with a minimum $\zeta$ occurring in between the extremes. Therefore, a SE image resolution can be increased by using secondary electrons only having low values of $\zeta$ and excluding the secondary electrons having high values of $\zeta$. Using the energy filter multiplexer of the present invention, this is performed by selecting a first and second energy level encompassing only the energy range wherein secondary electrons have a low value of $\zeta$. As a result, a smaller value of $\zeta$ provides a line profile 500 with shaper peaks to designate the edges of a critical dimension. For example, peaks 502 and 504 of curve 500 would become sharper and therefore it would allow smaller critical dimensions to be measured.

In alternative embodiments of the present invention, it is preferable to set the energy window at a level where the difference in the electron intensity for two different materials on the wafer is relatively large. Therefore, by selecting an energy window where the difference in intensity levels is the greatest, it is possible to obtain better contrast in signal values between two different materials on a specimen. This can assist the determination chemical differences on a specimen.

FIG. 6 is now presented to describe a method of using the energy filter multiplexer of the present invention to perform material mapping of a specimen (P. J. Goodhew, and F. J. Humpreys, "Electron Microscopy and Analysis" Ed. Taylor and Francis, 1988, p.154). Mapping refers to determining the spatial distribution of various types of materials on the specimen surface. For example, mapping can be used to determine the interface between a TiN region and a SiN region, or two dimensional dopant profiles. Mapping exploits the difference in the electron spectra of different materials. In fact, although some materials will have very similar electron energy distribution curves, a mapping process focuses on the energy ranges where two different materials show large differences. FIG. 6 illustrates a graph of two electron energy distribution curves, each representing two different materials for which their interface location is desired to be determined. Dashed-line curve 600 represents the energy curve for a first material. Solid-line curve 602 represents the energy curve for a second material. Curves 600 and 602 are very similar, however, they are different in some regions, such as 604 and 606. By setting the energy filter multiplexing to operate in regions that maximize the material contrast, it is possible to map the physical distribution of the two materials on the specimen surface. The resulting image will show one material region as a light area and the second material region as a dark area. Material mapping with the use of an energy filter multiplexer of the present invention can identify a material interface between two very similar materials. As is understood by those of ordinary skill in the art, all materials will have different energy spectrum curves and therefore energy window selection must be tailored to each inspection process to encompass the range wherein two materials have differing electron intensity values.

FIG. 7 is presented to describe a technique of using the energy filter multiplexer to perform spectroscopy. Spectroscopy allows for the determination of material properties based upon the energy spectrum of materials. FIG. 7 illustrates an electron energy spectrum curve 700 for a certain material obtained by using the energy filter multiplexer. The energy spectrum curve for a material is obtained by incrementally determining the output intensity current for discrete energy ranges for a material. Columns 702 of the energy spectrum curve 700 represent the individual intensity values that are accumulated to create the spectrum curve. The resolution of the spectrum curve can be adjusted by selecting the size of the energy windows used to obtain each incremental intensity value. It is possible to vary the size of the energy windows to optimize the signal to noise ratio. The intensity energy values for each discrete energy range is obtained until a full spectrum is developed. The incremental composition of the spectrum curve can be obtained from a minimum energy value of zero to the maximum, which is the electron beam energy. Alternatively, the spectrum can be created for only the portion of the energy spectrum that is of specific interest.

Figure 8:
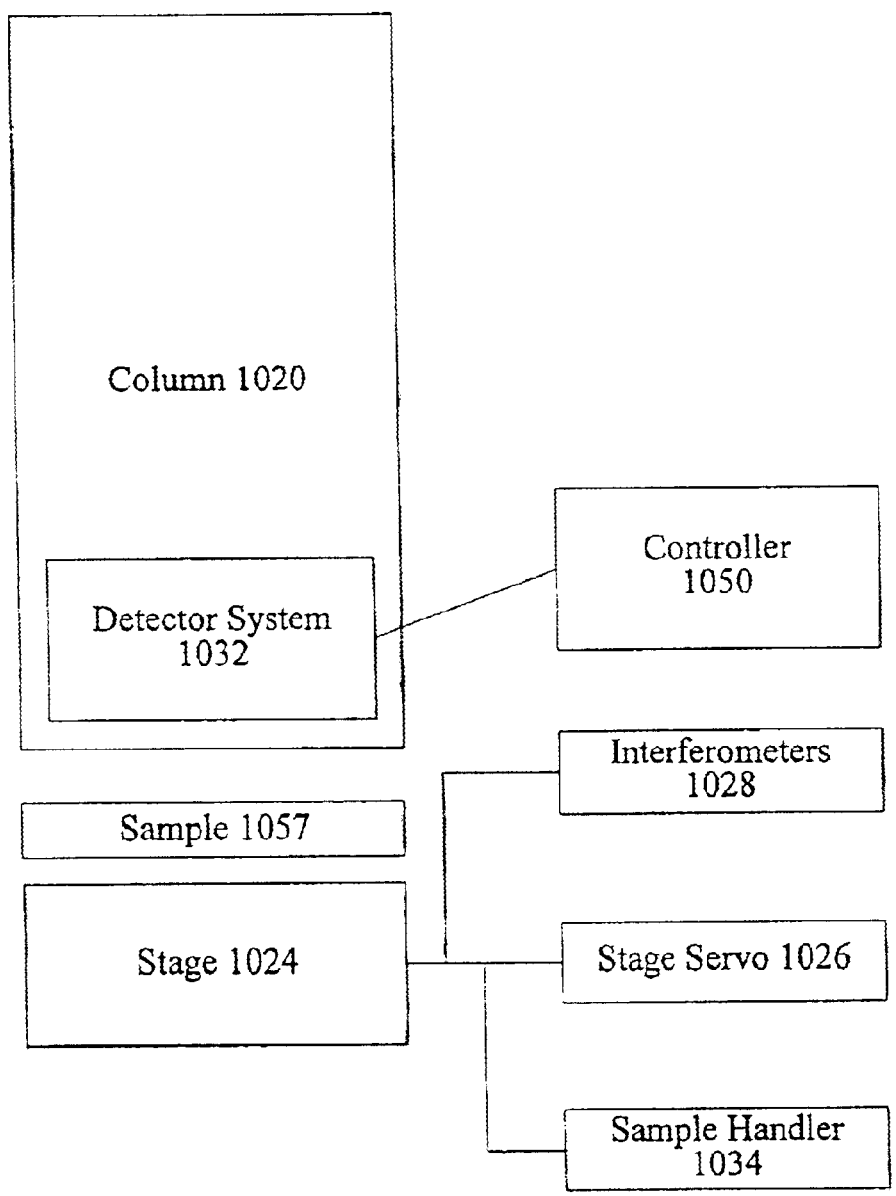
FIG. 8 is a diagrammatic representation of a scanning electron microscope (SEM) system in which the techniques of the present invention may be implemented.

FIG. 8 is a diagrammatic representation of a scanning electron microscope (SEM) system in which the techniques of the present invention may be implemented. The detail in FIG. 8 is provided for illustrative purposes. One skilled in the art would understand that variations to the system shown in FIG. 8 fall within the scope of the present invention. For example, FIG. 8 shows the operation of a particle beam with a continuously moving stage. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The position and movement of stage 1024 during the analysis of sample 1057 can be controlled by stage servo 1026 and interferometers 1028. Fine alignment of the sample can be achieved automatically or with the assistance of a system operator.

A detector system 1032 utilizing a high pass filter is aligned alongside the particle beam 1020 to facilitate defect detection. The detector 1032 as well as other elements can be controlled using a controller 1050. Controller 1050 may include a variety of processors, storage elements, and input and output devices. The controller may be configured to implement the imaging and multiplexing techniques of the present invention.

In one embodiment, the controller is a computer system having a processor and one or more memory devices. Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, sampling percentage areas, test structure characteristics (e.g., line width and spacing values), critical area curve calculations, and yield results, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for inspecting a specimen by detecting electrons that scatter from the specimen comprising:

scanning and directing an electron beam to irradiate a spot on the specimen, the electron beam causing the electrons to scatter from the irradiated spot on the specimen;

setting a high pass filter at a first voltage level, the first voltage level being predetermined;

detecting the scattered electrons with the high pass filter that is set at the first voltage level, the high pass filter detecting a first electron intensity level of the scattered electrons;

setting the high pass filter at a second voltage level, the second voltage level being predetermined;

detecting the scattered electrons with the high pass filter that is set at the second voltage level, the high pass filter detecting a second electron intensity level of the scattered electrons;

determining a differential electron intensity level, which is the difference between the first electron intensity level and the second electron intensity level, whereby the differential electron intensity level is the electron intensity level in an energy window between the first and second voltage level; and repeating each of the setting, detecting and determining operations to obtain additional differential electron intensity levels for successively irradiated spots along the scanned specimen, whereby the plurality of determined differential electron intensity levels provide inspection information about the specimen.

2. A method as recited in claim 1 wherein the plurality of differential electron intensity levels are used to generate a scanning electron image of the specimen.

3. A method as recited in claim 1 wherein the first and second voltage levels are set to encompass an energy spectrum wherein the respective scattered electrons that are detected are secondary electrons.

4. A method as recited in claim 3 wherein the first and second voltage levels are further set to encompass an energy spectrum such that secondary electrons displaying high mean free paths are not collected and secondary electrons displaying relatively lower mean free paths are detected, whereby the resolution of the inspection information is increased.

5. A method as recited in claim 1 wherein the first and second voltage levels are set to encompass an energy spectrum such that scattered electrons displaying high mean free paths are not collected and scattered electrons displaying relatively lower mean free paths are detected, whereby the resolution of the inspection information is increased.

6. A method as recited in claim 1 wherein the specimen is a semiconductor wafer and the inspection information is used to measure a critical dimension on the semiconductor wafer.

7. A method as recited in claim 1, wherein the electron intensity level corresponds to the measured number of scattered electrons.

8. A method for determining an interface between a first material and a second material on a specimen by detecting electrons that scatter from the specimen, the method comprising:

scanning and directing an electron beam to irradiate a spot on the specimen, the electron beam causing the electrons to scatter from the irradiated spot on the specimen;

setting a high pass filter at a first voltage level, the first voltage level being predetermined;

detecting the scattered electrons with the high pass filter that is set at the first voltage level, the high pass filter detecting a first electron intensity level of the scattered electrons;

setting the high pass filter at a second voltage level, the second voltage level being predetermined;

detecting the scattered electrons with the high pass filter that is set at the second voltage level, the high pass filter detecting a second electron intensity level of the scattered electrons;

determining a differential electron intensity level, which is the difference between the first electron intensity level and the second electron intensity level, the first voltage and the second voltage setting the limits to an electron energy range within which the first and second material emit different electron intensity levels;

repeating each of the setting, detecting and determining operations to obtain additional differential electron intensity levels for successively irradiated spots along the scanned specimen; and evaluating each of the additional differential electron intensity levels that are determined for a change in intensity levels between subsequently determined differential electron intensity levels, whereby the change between subsequently determined differential electron intensity levels indicates an interface between the first and second materials.

9. A method as recited in claim 8 wherein the plurality of differential electron intensity levels are used to generate a scanning electron image of the specimen.

10. A method as recited in claim 8 wherein the first and second voltage levels are set to encompass an energy spectrum wherein the respective scattered electrons that are detected are secondary electrons.

11. A method for performing spectroscopy on a specimen by detecting electrons that scatter from the specimen comprising:

directing an electron beam to irradiate a spot on the specimen, the electron beam causing the electrons to scatter from the irradiated spot on the specimen;

setting a high pass filter at a first voltage level, the first voltage level being predetermined;

detecting the scattered electrons with the high pass filter that is set at the first voltage level, the high pass filter detecting a first electron intensity level of the scattered electrons;

setting the high pass filter at a second voltage level, the second voltage level being predetermined;

detecting the scattered electrons with the high pass filter that is set at the second voltage level, the high pass filter detecting a second electron intensity level of the scattered electrons;

determining a differential electron intensity level, which is the difference between the first electron intensity level and the second electron intensity level, whereby the differential electron intensity level is the electron intensity level in an energy window between the first and second voltage level; and repeating each of the setting, detecting and determining operations to obtain additional differential electron intensity levels such that during each repeated cycle of setting, detecting and determining, the first voltage level is set to the second voltage level and the second voltage level is increased a determined increment, each of the successively determined differential electron intensity levels providing information as to an electron intensity spectrum for the specimen.

12. A method as recited in claim 11 wherein the first voltage level is initially set at zero and the final setting of the second voltage level is equal to the voltage level of the electron beam.

13. A method for inspecting a specimen by detecting electrons that scatter from the specimen comprising:

directing an electron beam to irradiate an inspected region on the specimen, the electron beam causing the electrons to scatter from the inspected region;

setting a high pass filter at a first voltage level, the first voltage level being predetermined;

detecting the scattered electrons with the high pass filter while set at the first voltage level, the high pass filter detecting a first electron intensity level of the scattered electrons that is used to generate a first image of the inspected region;

setting the high pass filter at a second voltage level, the second voltage level being predetermined;

detecting the scattered electrons with the high pass filter while set at the second voltage level, the high pass filter detecting a second electron intensity level of the scattered electrons that is used to generate a second image of the inspected region;

determining a first differential electron intensity level, which is the difference between the first electron intensity level and the second electron intensity level, wherein the first differential electron intensity level is the electron intensity level in an energy window between the first and second voltage level; and generating a first resulting image of the inspected region from the differential electron intensity level.

14. A method as recited in claim 13 further comprising sequentially repeating the operations of claim 12 wherein refreshed differential electron intensity levels and respective refreshed resulting images of the inspected region are continuously generated.

15. A method as recited in claim 14 wherein the refreshed resulting images are generated substantially immediately after the previously generated refreshed resulting image so that the specimen can be viewed substantially in real-time.

16. A method as recited in claim 14 wherein the repeated operation of setting the high pass filter at the first voltage level is performed simultaneously with the operation of determining the first differential electron intensity level.

17. A method as recited in claim 14 further comprising:
scanning the electron beam such that the inspected region covers a new area on the specimen, the refreshed resulting images thereby representing images of the new area covered by the inspected region.

18. A method as recited in claim 13 wherein the first and second voltage levels are set to encompass an energy spectrum wherein the respective scattered electrons that are detected are secondary electrons.

19. A method as recited in claim 13 wherein the first and second voltage levels are set to encompass an energy spectrum such that scattered electrons displaying high mean free paths are not collected and scattered electrons displaying relatively lower mean free paths are detected, whereby the resolution of the inspection information is increased.

20. A method as recited in claim 13 wherein the specimen is a semiconductor wafer and the inspection information is used to measure a critical dimension on the semiconductor wafer.

21. An inspection system comprising:
a beam generator for generating an electron beam;
a detector having a high pass filter for detecting scattered electrons; and
a controller arranged to:
set the high pass filter at a first voltage level such that the detector detects the scattered electrons with the high pass filter while set at the first voltage level, the first voltage level being predetermined, the high pass filter detecting a first electron intensity level of the scattered electrons that is used to generate a first image of the inspected region;
set the high pass filter at a second voltage level such that the detector detects the scattered electrons with the high pass filter while set at the second voltage level, the second voltage level being predetermined, the high pass filter detecting a second electron intensity level of the scattered electrons that is used to generate a second image of the inspected region;
determine a first differential electron intensity level, which is the difference between the first electron intensity level and the second electron intensity level, wherein the first differential electron intensity level is the electron intensity level in an energy window between the first and second voltage level; and
generate a first resulting image of the inspected region from the differential electron intensity level.

\* \* \* \* \*